(12) United States Patent
Li et al.

(10) Patent No.: US 11,903,284 B2
(45) Date of Patent: Feb. 13, 2024

(54) PIXEL STRUCTURE, DISPLAY PANEL AND DISPLAY APPARATUS

(71) Applicants: Hefei Xinsheng Optoelectronics Technology Co., Ltd., Anhui (CN); BOE Technology Group Co., Ltd., Beijing (CN)

(72) Inventors: Meng Li, Beijing (CN); Yongqian Li, Beijing (CN); Zhidong Yuan, Beijing (CN); Can Yuan, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 470 days.

(21) Appl. No.: 17/287,997

(22) PCT Filed: Aug. 7, 2020

(86) PCT No.: PCT/CN2020/107809
§ 371 (c)(1),
(2) Date: Apr. 23, 2021

(87) PCT Pub. No.: WO2021/027726
PCT Pub. Date: Feb. 18, 2021

(65) Prior Publication Data
US 2021/0384288 A1    Dec. 9, 2021

(30) Foreign Application Priority Data
Aug. 12, 2019   (CN) .................. 201910740615.0

(51) Int. Cl.
*H10K 59/131*   (2023.01)
*H10K 59/35*    (2023.01)
*H10K 59/121*   (2023.01)

(52) U.S. Cl.
CPC ....... *H10K 59/1315* (2023.02); *H10K 59/121* (2023.02); *H10K 59/131* (2023.02); *H10K 59/353* (2023.02)

(58) Field of Classification Search
CPC ............. H10K 59/1315; H10K 59/353; H10K 59/131; H10K 59/121
See application file for complete search history.

(56) References Cited

U.S. PATENT DOCUMENTS

| 2004/0100203 A1 | 5/2004 | Kobayashi et al. |
| 2014/0175449 A1 | 6/2014 | Kasahara |

(Continued)

FOREIGN PATENT DOCUMENTS

| CN | 105097873 A | 11/2015 |
| CN | 105425485 A | 3/2016 |

(Continued)

OTHER PUBLICATIONS

International Search Report for PCT/CN2020/107809 dated Nov. 11, 2020.

(Continued)

*Primary Examiner* — Wasiul Haider
(74) *Attorney, Agent, or Firm* — Ling Wu; Stephen Yang; Ling and Yang Intellectual Property

(57) ABSTRACT

A pixel structure includes: gate lines and data lines disposed crosswise and a plurality of pixel repetition modules distributed in an array. A pixel repetition module includes: a plurality of pixel units arranged in order, wherein each pixel unit includes three sub-pixels arranged in a triangular structure, and the three sub-pixels in each pixel unit and the three sub-pixels in an adjacent pixel unit are arranged inversely with respect to each other; each pixel unit corresponds to two groups of gate lines, wherein each group of gate lines includes two gate lines parallel to each other, a first group of (Continued)

gate lines are located on a first outer side and a second outer side of the pixel units respectively, and a second group of gate lines are both located between the sub-pixels located in a first row and the sub-pixels located in a second row in the pixel units.

20 Claims, 3 Drawing Sheets

(56)  References Cited

U.S. PATENT DOCUMENTS

| | | | |
|---|---|---|---|
| 2017/0061865 A1 | 3/2017 | Park et al. | |
| 2017/0117334 A1 | 4/2017 | Guo et al. | |
| 2018/0096663 A1 | 4/2018 | Xu | |
| 2018/0269268 A1* | 9/2018 | Cai | H10K 59/122 |
| 2019/0181207 A1* | 6/2019 | Kim | H10K 59/124 |
| 2020/0082756 A1 | 3/2020 | Lin et al. | |
| 2021/0193035 A1 | 6/2021 | Li et al. | |

FOREIGN PATENT DOCUMENTS

| | | |
|---|---|---|
| CN | 105609077 A | 5/2016 |
| CN | 106486059 A | 3/2017 |
| CN | 206322697 U | 7/2017 |
| CN | 108133947 A | 6/2018 |
| CN | 108628049 A | 10/2018 |
| CN | 110060633 A | 7/2019 |
| CN | 110429124 A | 11/2019 |
| JP | 8-95027 A | 4/1996 |
| KR | 10-2015-0079003 A | 7/2015 |

OTHER PUBLICATIONS

Office Action dated Mar. 31, 2021 for Chinese Patent Application No. 201910740615.0 and English Translation.
Office Action dated Oct. 27, 2021 for Chinese Patent Application No. 201910740615.0 and English Translation.

* cited by examiner

PIXEL STRUCTURE, DISPLAY PANEL AND DISPLAY APPARATUS

CROSS-REFERENCE TO RELATED APPLICATIONS

The present application is a U.S. National Phase Entry of International Application No. PCT/CN2020/107809 having an international filing date of Aug. 7, 2020, which claims priority from Chinese Patent Application No. 201910740615.0 entitled "Pixel Structure, Display Panel and Display Apparatus" and filed on Aug. 12, 2019. The entire contents of the above-identified applications are hereby incorporated by reference.

TECHNICAL FIELD

Embodiments of the present disclosure relate to, but are not limited to, the field of display technology, and particularly to a pixel structure, a display panel and a display apparatus.

BACKGROUND

With the continuous development of display technology, the traditional liquid crystal display apparatuses have been replaced gradually by organic electroluminescent display panels (OLEDs). According to different driving modes, the OLEDs may be divided into passive matrix organic light emitting diode display panels (PMOLEDs) and active matrix organic electroluminescent display panels (AMOLEDs). The AMOLED display panels have the advantages of low power consumption, low cost and large size.

In the AMOLED display panels, multiple gate lines and multiple data lines, and multiple pixel units are generally included, and a pixel arrangement space is limited and internal signal wiring is dense and various, such that the current AMOLED display panels cannot have high resolution.

SUMMARY

A summary of the subject matter described in detail herein is provided below. The summary is not intended to limit the protection scope of the claims.

The present disclosure provides a pixel structure, a display panel and a display apparatus, in which sub-pixels in adjacent pixel units in a pixel repetition module are arranged in a triangular shape or an inverted triangular shape respectively, two gate lines in a first group of gate lines are located on a first outer side and a second outer side of the pixel units respectively, and two gate lines in a second group of gate lines are both located between the sub-pixels in a first row and the sub-pixels in a second row in the pixel units, such that multiple sub-pixels located in the same row in the adjacent pixel units may be connected to the same gate line.

According to a first solution of the present disclosure, an embodiment of the present disclosure provides a pixel structure, including: gate lines and data lines disposed crosswise and multiple pixel repetition modules distributed in an array; a pixel repetition module includes multiple pixel units arranged in order, wherein each pixel unit includes three sub-pixels arranged in a triangular structure, and the three sub-pixels in each pixel unit and the three sub-pixels in its adjacent pixel unit are arranged inversely with respect to each other; each pixel unit corresponds to two groups of gate lines, wherein each group of gate lines include two gate lines parallel to each other, a first group of gate lines are located on a first outer side and a second outer side of the pixel units respectively, and a second group of gate lines are located between the sub-pixels located in a first row and the sub-pixels located in a second row in the pixel units.

In some exemplary embodiments, two gate lines in the first group of gate lines are respectively connected to two sides, closest to the gate lines, of the sub-pixel located in the first row and the sub-pixel located in the second row in each pixel unit, and two gate lines in the second group of gate lines are respectively connected to two sides, closest to the gate lines, of the sub-pixel located in the first row and the sub-pixel located in the second row in each pixel unit.

In some exemplary embodiments, the gate lines include vertical parts, through which the gate lines are connected to the corresponding sub-pixels.

In some exemplary embodiments, distances from the two gate lines in the first group of gate lines to the corresponding sub-pixels are equal; and distances from the two gate lines in the second group of gate lines to the corresponding sub-pixels are equal.

In some exemplary embodiments, in a pixel repetition module, the data line is connected to two longitudinally adjacent sub-pixels in the same pixel unit respectively, or the data line is respectively connected to two longitudinally adjacent sub-pixels respectively located in the two adjacent pixel units.

In some exemplary embodiments, the data line includes a first vertical part and a second vertical part parallel to each other, and a horizontal part connecting the first vertical part with the second vertical part is disposed between the first vertical part and the second vertical part.

In some exemplary embodiments, nodes are disposed on the first vertical part and the second vertical part, and the data line is connected to two corresponding sub-pixels through the nodes respectively disposed on the first vertical part and the second vertical part.

In some exemplary embodiments, one or two nodes are disposed on the horizontal part, and the data line is connected to the two sub-pixels through the one or two nodes.

In some exemplary embodiments, there is one node disposed on the horizontal part, and the data line is connected to the two sub-pixels through the one node respectively.

In some exemplary embodiments, there are two nodes disposed on the horizontal part, and each node is connected to one of two sub-pixels respectively.

In some exemplary embodiments, the pixel structure further includes sensing lines, wherein one sensing line is connected to one of the pixel units in one pixel repetition module.

In some exemplary embodiments, that one sensing line is connected to one of the pixel units includes: the sensing line is connected to a side of the sub-pixel located in the first row in one of the pixel units, and is respectively connected to a side of the two sub-pixels located in the second row; or the sensing line is respectively connected to a side of the two sub-pixels located in the first row in one of the pixel units, and is connected to a side of the sub-pixel located in the second row.

In some exemplary embodiments, the pixel structure further includes: power lines, wherein a horizontal part of each power line is connected to the first outer side or the second outer side of multiple pixel units located in the same row.

In some exemplary embodiments, each pixel unit corresponds to two power lines, wherein the horizontal part of one power line is connected to a side, closest to the power line, of the sub-pixel located in the first row in each pixel unit, and the horizontal part of the other power line is connected to a side, closest to the power line, of the sub-pixel located in the second row in each pixel unit.

In some exemplary embodiments, a distance from the horizontal part of each power line to the sub-pixel connected thereto is equal.

In some exemplary embodiments, the three sub-pixels in each pixel unit are sub-pixels of different colors.

According to a second solution of the present disclosure, an embodiment of the present disclosure further provides a display panel, including the pixel structure according to any one in the present disclosure.

According to a third solution of the present disclosure, an embodiment of the present disclosure further provides a display apparatus, including the pixel structure according to any one in the present disclosure.

It should be understood that both the foregoing general description and the following detailed description are exemplary and illustrative only, and are not intended to limit the present disclosure.

This section provides an overview of various implementations or examples of the technology described in the present disclosure, and is not a comprehensive disclosure of the full scope or all features of the disclosed technology.

Other aspects may be understood upon reading and understanding the accompanying drawings and the detailed description.

BRIEF DESCRIPTION OF DRAWINGS

In order to explain technical solutions of embodiments of the present disclosure more clearly, the accompanying drawings of the embodiments will be introduced briefly below. Obviously, the accompanying drawings in the following description only relate to some embodiments of the present disclosure, but do not limit the present disclosure.

DESCRIPTION OF THE DRAWING REFERENCE SIGNS

G1_1/G1_2—first gate line; G2_1/G2_2—second gate line; G—gate line; D—data line; S—sensing line; VDD—power line; N1—common node; T1—first transistor; T2—second transistor; T3—third transistor; Cst—storage capacitor; OLED—light emitting element;

10—pixel repetition module; 11—first pixel unit; 12—second pixel unit; 20—first sub—pixel; 30—second sub—pixel; 40—third sub—pixel; 100—display apparatus; 110—substrate; 120—buffer layer; 130—insulating layer; 140—thin film transistor; 150—passivation layer; 160—resin layer; 170—transparent electrode; 180—pixel definition layer; 190—light emitting layer; 200—cathode.

DETAILED DESCRIPTION

Technical solutions of embodiments of the present disclosure will described clearly and completely in combination with the drawings of embodiments of the present disclosure. Apparently, the described embodiments are a part of the embodiments of the present disclosure, not all of the embodiments. Based on the described embodiments of the present disclosure, all other embodiments obtained by those of ordinary skill in the art without creative work are within the protection scope of the present disclosure.

Unless otherwise defined, technical terms or scientific terms used in the present disclosure shall have the ordinary meaning understood by those of ordinary skill in the art to which the present disclosure pertains. A word such as "include", "contain", or the like, means that elements or articles preceding the word cover elements or articles listed after the word and their equivalents, and do not exclude other elements or articles. "Upper", "lower", "left", "right" and the like are merely used to indicate a relative positional relationship. After an absolute position of a described object is changed, the relative positional relationship may also be changed accordingly.

In the present disclosure, when a specific device is described to be located between a first device and a second device, there may or may not be an intervening device between the specific device and the first device or the second device. When the specific device is described to be connected to another device, the specific device may be directly connected to the another device without intervening devices, or may have an intervening device without being directly connected to the another device.

In order to keep the following description of the embodiments of the present disclosure clear and concise, detailed descriptions of known functions and known components are omitted in the present disclosure.

Figure 1:
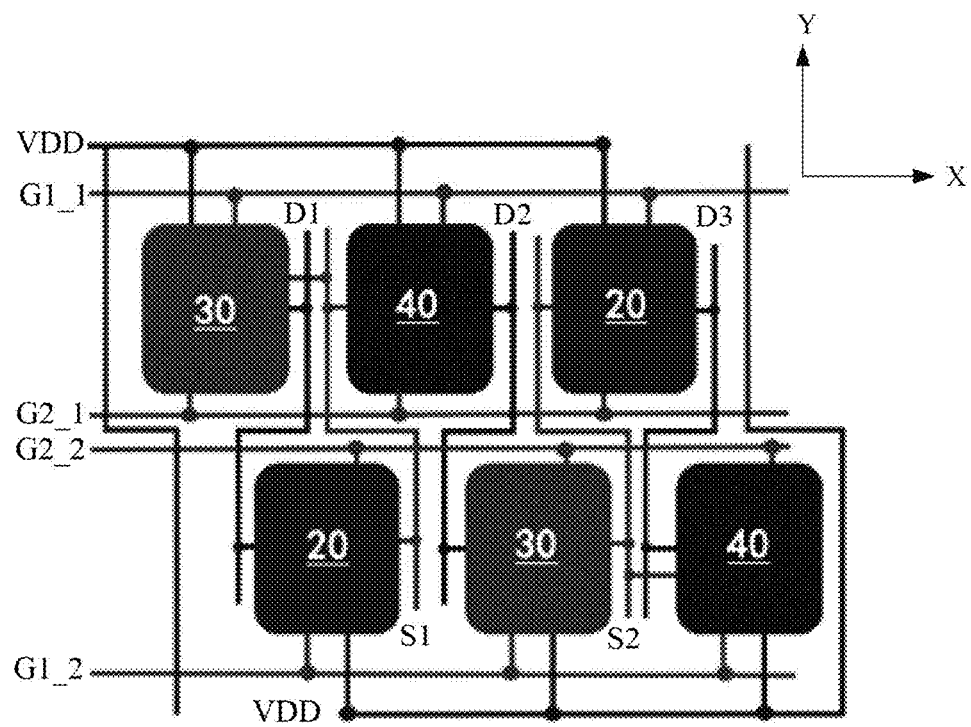
FIG. 1 is a schematic diagram of a pixel circuit according to an embodiment of the present disclosure.
Figure 2:
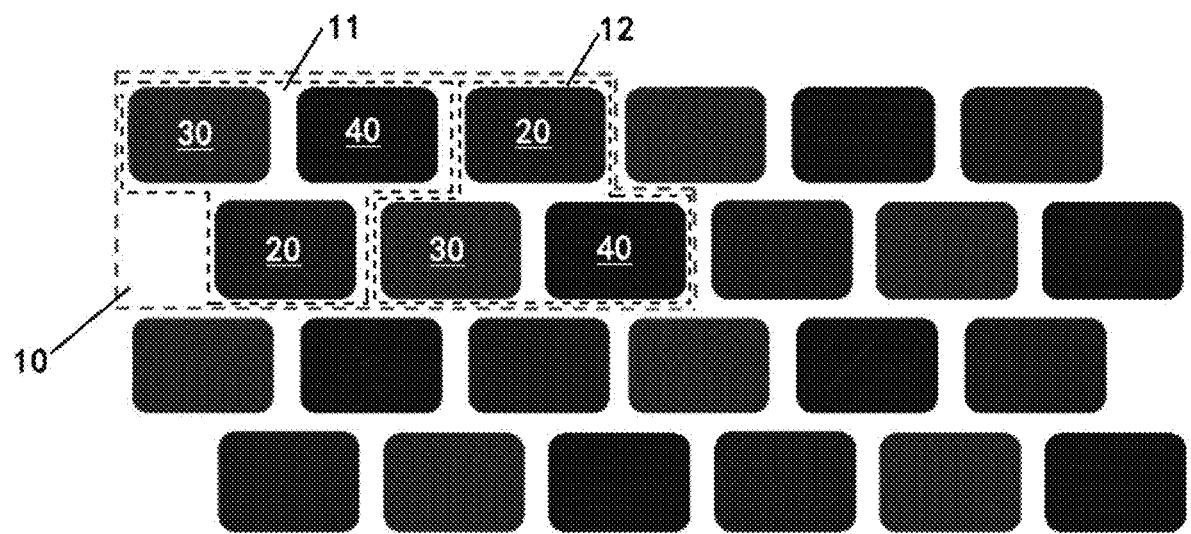
FIG. 2 is a schematic diagram of a pixel repetition module according to an embodiment of the present disclosure.

FIG. 1 is a schematic diagram of a pixel structure according to an embodiment of the present disclosure. As shown in FIG. 1, the present disclosure provides a pixel structure, including: gate lines G and data lines D disposed crosswise, and multiple pixel repetition modules distributed in an array, wherein the multiple pixel repetition modules may be arranged in the array in a certain order to form a display unit. FIG. 2 shows a schematic diagram of a pixel repetition module 10, wherein the pixel repetition module 10 includes multiple pixel units arranged in order, each pixel unit including three sub-pixels. For example, in the present embodiment, taking a first pixel unit 11 and a second pixel unit 12 adjacently disposed as an example, each of the first pixel unit 11 and the second pixel unit 12 includes a first sub-pixel 20, a second sub-pixel 30 and a third sub-pixel 40, wherein the three sub-pixels in each pixel unit may be three types of basic sub-pixels, namely, red sub-pixel, green sub-pixel and blue sub-pixel. Of course, sub-pixels of other colors may also be configured, and selection of colors of the sub-pixels is not limited in the present disclosure.

As shown in FIG. 2, in an example, each pixel unit includes three sub-pixels arranged in a triangular structure, and the three sub-pixels in each pixel unit and the three sub-pixels in its adjacent pixel unit are arranged in inversely with respect to each other. For example, the triangular structure includes two rows arranged in parallel. For an upright triangular structure, the first row therein may include one sub-pixel, and the second row may include two sub-pixels arranged in parallel; for an inverted triangular structure, the first row therein may include two sub-pixels arranged in parallel, and the second row may include one sub-pixel. Thus, each pixel unit includes two rows of sub-pixels. For example, as shown in FIG. 2, a first sub-pixel unit 11 and a second sub-pixel unit 12 adjacently disposed are arranged in an inverted triangle and a triangle respectively, so as to form an integral pixel repetition module 10.

In an exemplary embodiment, the pixel units 11 and 12 in the pixel repetition module 10 shown in FIG. 2 correspond to pixel units in FIG. 1, that is, the first sub-pixel 20, the second sub-pixel 30 and the third sub-pixel 40 arranged in an inverted triangle structure shown in FIG. 1 correspond to the sub-pixels 20 to 40 in the first pixel unit 11 shown in FIG. 2, and the first sub-pixel 20, the second sub-pixel 30 and the third sub-pixel 40 arranged in a triangle structure shown in FIG. 1 correspond to the sub-pixels 20 to 40 in the second pixel unit 12 shown in FIG. 2.

The above naming of the sub-pixels is only an example, and does not represent ordering of the sub-pixels, but only represent the difference between the three pixels. In embodiments of the present disclosure, multiple sub-pixels in a pixel unit may be named in another mode. For example, in FIG. 1 or FIG. 2, the sub-pixel labeled as 30 is the first sub-pixel, the sub-pixel labeled as 40 is the second sub-pixel, and the sub-pixel labeled as 20 is the third sub-pixel, etc.

In the embodiment of the present disclosure shown in FIG. 1, the data lines D may include D1, D2 and D3, the sensing lines S include S1 and S2, the first group of gate lines include two first gate lines G1_1 and G1_2, and the second group of gate lines include two second gate lines G2_1 and G2_2.

In an example, as shown in FIG. 1, each pixel unit corresponds to two groups of gate lines, wherein each group of gate lines includes two gate lines parallel to each other. For example, the first sub-pixel unit 11 corresponds to two groups of gate lines G, wherein two first gate lines G1_1 and G1_2 in the first group of gate lines are located on a first outer side and a second outer side of the pixel unit respectively, that is, one of the first gate lines (e.g., G1_1) is located on a side of the first row of sub-pixels away from the second row of sub-pixels in a triangular structure (or an inverted triangular structure). The other of the first gate lines (e.g., G1_2) is located on a side of the second row of sub-pixels away from the first row of sub-pixels in the triangular structure (or an inverted triangular structure). Two second gate lines G2_1 and G2_2 in the second group of gate lines are both located between the sub-pixels located in the first row and the sub-pixels located in the second row in the pixel unit, that is, the two second gate lines are disposed in parallel and located between the first row of sub-pixels and the second row of sub-pixels in the triangular structure (or the inverted triangular structure).

In an example, each sub-pixel in the pixel unit has, in its inner part, its corresponding pixel circuit, and the gate lines in the pixel structure of the present disclosure are connected to a gate of a transistor in the pixel circuit of each sub-pixel to control opening and closing of the transistor. Optionally, the structures of the pixel circuits are various, and quantities of gates used for connecting the gate lines in the pixel circuits with different structures are different. In the present embodiment, a pixel circuit shown in FIG. 3 is taken as an example, but the present disclosure is not limited thereto.

Figure 3:
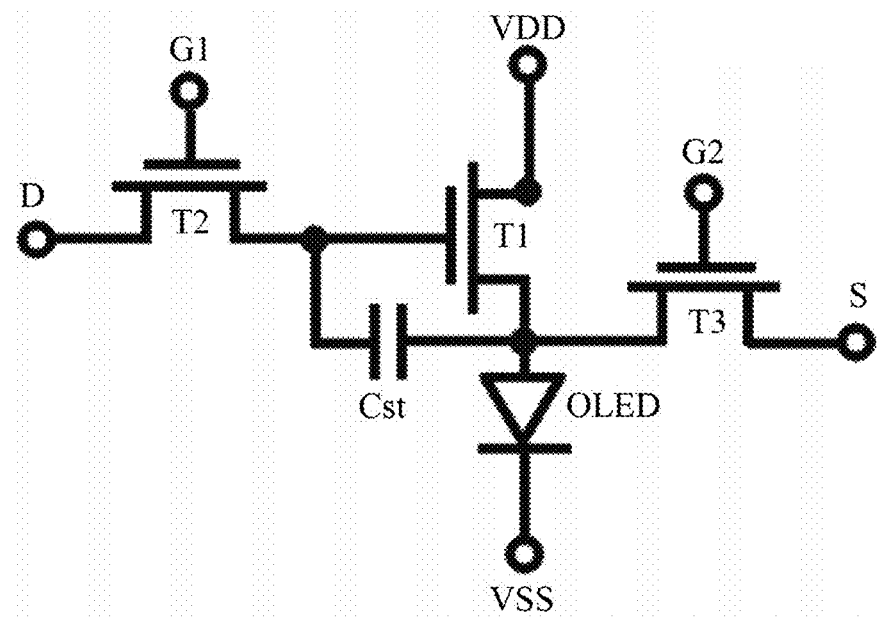
FIG. 3 is a schematic structural diagram of a pixel circuit according to an embodiment of the present disclosure.

As shown in FIG. 3, the pixel circuit may include a first transistor T1, a second transistor T2, a third transistor T3, a storage capacitor Cst and a light emitting element OLED.

For example, a gate G1 of the second transistor T2 is configured to connect to the gate lines in the pixel structure, a first pole and a second pole of the second transistor T2 are connected to the data lines D in the pixel structure and a gate of the first transistor T1 respectively, a gate G2 of the third transistor T3 is configured to connect to the gate lines in the pixel structure, a first pole and a second pole of the third transistor T3 are connected to a second pole of the first transistor T1 and the sensing lines S in the pixel structure respectively, a first pole of the first transistor T1 is configured to connect to a power line VDD in the pixel structure, a first end and a second end of the storage capacitor Cst are connected to the second pole of the second transistor T2 and the second pole of the first transistor T1 respectively, and a first pole and a second pole of the light emitting element OLED are connected to the second pole of the first transistor T1 and a second power line VSS respectively.

It may be seen from FIG. 3 that the pixel circuit corresponding to each sub-pixel has two gates G1 and G2. Combined with that shown in FIG. 1, the gate G1 of the second transistor T2 in the pixel circuit is connected to a gate line in a group of gate lines in the pixel structure, and the gate G2 of the third transistor T3 in the pixel circuit is connected to a gate line in another group of gate lines in the pixel structure. For example, in the present embodiment, the gate G1 in the pixel circuit corresponding to each pixel is connected to the first gate line G1_1 or G1_2, and the gate G1 is connected to the second gate line G2_1 or G2_2.

As described above, three sub-pixels in each pixel unit are arranged in a triangular structure or an inverted triangular structure, then three sub-pixels in the pixel unit adjacent thereto are arranged in an inverted triangular structure or a triangular structure, such that the three sub-pixels, in the two pixel units which are adjacent, are arranged inversely with respect to each other. For example, as shown in FIGS. 1 and 2, the sub-pixels, in the first pixel unit 11 and the second pixel unit 12 which are adjacent, are arranged in an inverted triangle and a triangle, respectively.

In an example, the first row of the triangular structure may include one sub-pixel, and the second row of the triangular structure may include two sub-pixels adjacently arranged. The first row of the inverted triangle may include two sub-pixels adjacently arranged and the second row may include one sub-pixel. Thus, it is caused that the sub-pixel 20 in the first row in the second pixel unit 12 arranged in a triangle is located in the same row as the two sub-pixels 30 and 40 in the same row in the adjacent first pixel unit 11 arranged in an inverted triangle, and the two sub-pixels 30 and 40 in the second row in the second pixel unit 12 are located in the same row as the sub-pixels 20 in the same row in the adjacent first pixel unit 11.

As shown in FIG. 1, two first gate lines G1_1 and G1_2 are respectively located on the outer side of the first row of sub-pixels (i.e., the first outer side of the pixel units, or the side of the first row of sub-pixels away from the second row of sub-pixels) and the outer side of the second row of sub-pixels (i.e., the second outer side of the pixel units, or the side of the second row of sub-pixels away from the first row of sub-pixels), and two second gate lines G2_1 and G2_2 are respectively located between the first row of sub-pixels and the second row of sub-pixels. Such an arrangement causes that the sub-pixels located in the same row in the two adjacent pixel units, i.e., the first pixel unit 11 and the second pixel unit 12, may be connected to the same gate line, to reduce a quantity of gate lines arranged in a limited pixel space, which can improve a utilization rate of the pixel space, so that electrical and optical compensation functions of a display apparatus may be realized in the limited pixel space.

According to the pixel structure provided by the embodiment of the present disclosure, three sub-pixels in the pixel unit are arranged in a triangular structure, and three sub-pixels in each pixel unit and three sub-pixels in its adjacent pixel unit are arranged inversely with respect to each other, two first gate lines G1_1 and G1_2 are located on the first outer side and the second outer side of the pixel unit respectively, and each of the two second gate lines G2_1 and G2_2 is located between the sub-pixels located in the first row and the sub-pixels located in the second row in the pixel unit, such that multiple sub-pixels located in the same row, in two pixel units which are adjacent, may be connected to the same gate line, to reduce a quantity of the gate lines arranged in the limited pixel space and improve the utilization rate of the pixel space, thereby improving a display quality.

In the embodiment of the present disclosure, for convenience of understanding, taking the third sub-pixel 40 in the first row in the first pixel unit 11 as an example, the side of each sub-pixel is defined, a side, closest to the first gate line G1_1, of this third sub-pixel 40 is defined as a first face, a side, closest to the second gate line G2_1, of this third sub-pixel 40 is defined as a second face, a side, close to the same pixel unit (i.e., the first pixel unit 11), of this third sub-pixel 40 is defined as a third face, and a side, close to the adjacent pixel unit (i.e., the second pixel unit 12), of this third sub-pixel 40 is defined as a fourth face. The first face of the third sub-pixel 40 located in the second row in the second pixel unit 12 is a side closest to the second gate line G2_2, the second face thereof is a side closest to the first gate line G1_2, the third face thereof is a side close to the second sub-pixel 30 in the second pixel unit 12, and the fourth face thereof is a side close to the sub-pixel (not shown in FIG. 1) located in the second row in the third pixel unit. Taking an x direction and a y direction shown in FIG. 1 as an example, for any one sub-pixel, a side facing the y direction is the first face, a side away from the y direction is the second face, a side away from the x direction is the third face, and a side facing the x direction is the fourth face.

Those skilled in the art should understand that the actual sub-pixel is not a regular quadrangle, and the above definitions are only for the convenience of understanding of the technical solutions of the present disclosure by those skilled in the art.

In some embodiments, two first gate lines G1_1 and G1_2 in the first group of gate lines are respectively connected to two sides, closest to the first gate lines G1_1 and G1_2, of the sub-pixels located in the first row and the sub-pixels located in the second row in the pixel units, that is, respectively connected to the first face of the sub-pixels located in the first row and the second face of the sub-pixels located in the second row. Two second gate lines G2_1 and G2_2 in the second group of gate lines are respectively connected to two sides, closest to the second gate lines G2_1 and G2_2, of the sub-pixels located in the first row and the sub-pixels located in the second row in the pixel units, that is, respectively connected to the second face of the sub-pixels located in the first row and the first face of the sub-pixels located in the second row.

In some embodiments, the gate lines include vertical parts, through which the gate lines are connected to the corresponding sub-pixels. Each gate line may have multiple vertical parts, which may be perpendicular to a main line in a horizontal direction. In an example, as shown in FIG. 1, taking the second sub-pixel 30 located in the first row in the first pixel unit 11 as an example, the first gate line G1_1 is connected to the second sub-pixel 30 through the vertical part thereof, and the second gate line G2_1 is connected to the second sub-pixel 30 through the vertical part thereof.

For example, gates of the pixel circuits corresponding to the second sub-pixel 30 and the third sub-pixel 40 located in the first row in the first pixel unit 11 and the same gates of the pixel circuit corresponding to the first sub-pixel 20 located in the second row in the first pixel unit 11 are arranged in an opposite direction, such that the first gate line G1_1 is connected to the first face of the second sub-pixel 30 located in the first row and the first face of the third sub-pixel 40 located in the first row, the second gate line G1_2 is connected to the second face of the first sub-pixel 20 located in the second row, the second gate line G2_1 is connected to the second face of the second sub-pixel 30 located in the first row and the second face of the third sub-pixel 40 located in the first row in the first pixel unit 11, and the second gate line G2_2 is connected to the first face of the first sub-pixel 20 located in the second row.

For example, the same sides of a sub-pixel in each pixel unit and sub-pixels of its adjacent pixel unit located in the same row as the sub-pixel may all be connected to the same gate line. As shown in FIG. 1, in two adjacent pixel units 11 and 12, the first faces of a total of three sub-pixels located in the first row in the first pixel unit 11 and the second pixel unit 12 are all connected to the same first gate line G1_1. In addition, the second faces of these three sub-pixels may all be connected to the same second gate line G2_1, the second faces of the three sub-pixels located in the second row may all be connected to the same first gate line G1_2, and the first faces of these three sub-pixels are all be connected to the same second gate line G1_2, the same gate lines being arranged parallel to each other without crossing. With such an arrangement, a quantity of the gate lines arranged in the limited pixel space may be reduced to increase the utilization rate of the pixel space.

In some embodiments, distances from the two first gate lines G1_1 and G1_2 in the first group of gate lines to the corresponding sub-pixels (i.e., the sub-pixels connected to the two first gate lines) are equal. Distances from the two second gate lines G2_1 and G2_2 in the second group of gate lines to the corresponding sub-pixels are equal, such that when multiple gate lines output low-level or high-level scanning voltages, transistors of the pixel circuits corresponding to the sub-pixels located in the same row are turned on or off at the same time to ensure the display effect.

As described above, the pixel structure of the embodiment of the present disclosure includes the data lines D, as shown in FIG. 1, wherein each data line D may correspond to (be connected to) two longitudinally adjacent sub-pixels in the same pixel unit or correspond to (be connected to) two longitudinally adjacent sub-pixels in two adjacent pixel units. For example, the sub-pixels in the two adjacent pixel units are arranged inversely with respect to each other, and the two longitudinally adjacent sub-pixels corresponding to the same data line D may be the sub-pixels in the same pixel unit or the sub-pixels in the two adjacent pixel units respectively. For example, as shown in FIG. 1, the second sub-pixel 30 and the first sub-pixel 20 longitudinally adjacent in the first pixel unit 11 correspond to the same data line D1, the third sub-pixel 40 located in the first row in the first pixel unit 11 and the second sub-pixel 30 located in the second row in its adjacent second pixel unit 12 correspond to the same data line D2, such that the six sub-pixels in the two adjacent pixel units correspond to three data lines D. Such an arrangement may reduce a quantity of the data lines D and improve the utilization rate of the pixel space.

Figure 4:
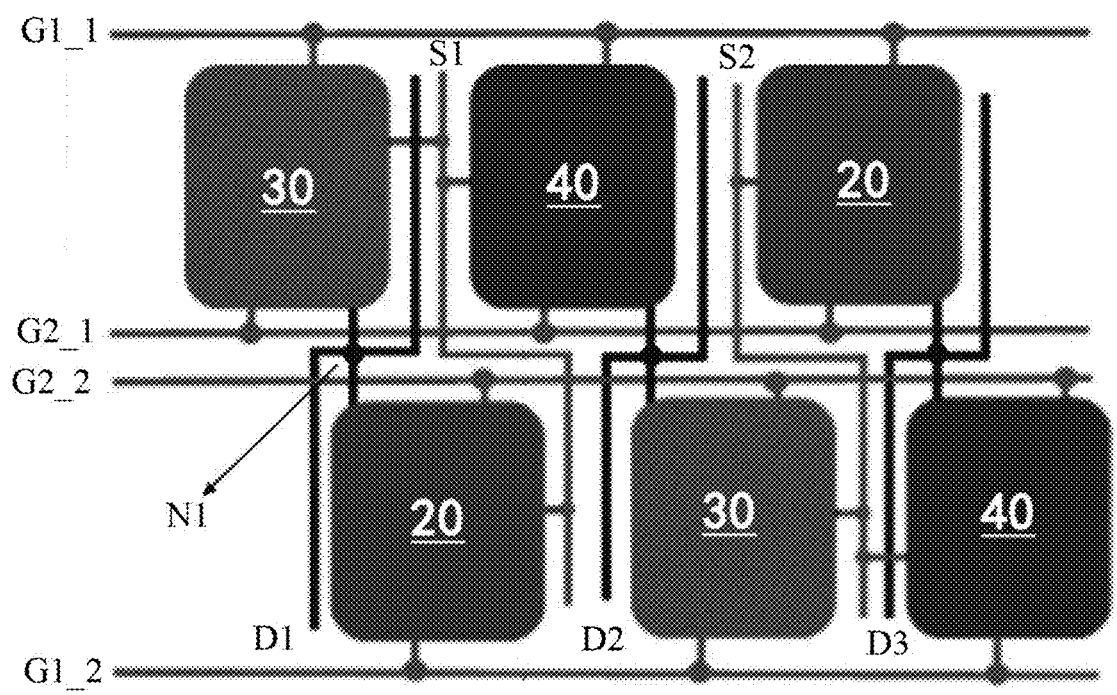
FIG. 4 is a schematic diagram of a pixel structure according to another embodiment of the present disclosure.
Figure 5:
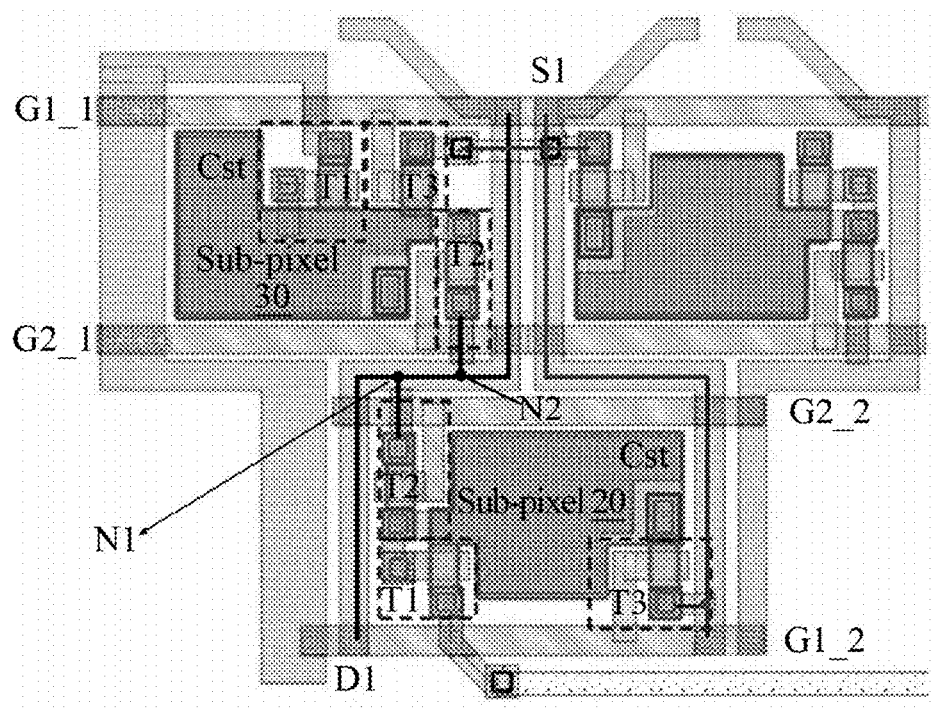
FIG. 5 is a schematic diagram of a layout of a pixel structure according to an embodiment the present disclosure.

In some exemplary embodiments, in order to ensure connections between the data lines D and the corresponding two sub-pixels, a connection mode between the data lines D and the corresponding two sub-pixels may be set. For example, each data line D includes a first vertical part and a second vertical part, wherein the first vertical part and the second vertical part are parallel to each other. The first vertical part and the second vertical part may be arranged on a side of the third face or the fourth face of the corresponding sub-pixel, and a horizontal part connecting the first vertical part with the second vertical part is disposed between the first vertical part and the second vertical part, wherein the horizontal part is located between two sub-pixels corresponding to the data line D. In an example, nodes may be disposed on the first vertical part and the second vertical part, and as shown in FIG. 1, the data line D is connected to the two corresponding sub-pixels through the nodes respectively disposed on the first vertical part and the second vertical part. In another example, a node is disposed on the horizontal part, and the data line D is connected to the two corresponding sub-pixels through the node. The node may be a common node as shown in FIG. 4 or two nodes corresponding to the two sub-pixels as shown in FIG. 5. The node connecting the data line D with the corresponding sub-pixel is disposed on the horizontal part, such that the distance between two nodes, on the data line D, respectively connected to the corresponding two sub-pixels may be reduced as much as possible, thereby reducing a difference in resistances value and/or capacitance values of the data line D respectively entering the pixel circuits corresponding to the two sub-pixels, so as to prevent uneven display brightness due to a larger difference in the resistance values and/or the capacitance values of the data line D respectively entering the pixel circuits corresponding to the two sub-pixels, in a case that a charging rate cannot meet a predetermined condition, thereby affecting the display effect.

In some embodiments, in a pixel repetition module, an arrangement form in which one data line D corresponds to two longitudinally adjacent sub-pixels in the same pixel unit includes: when three sub-pixels in a pixel unit are arranged in a triangle, the data line D is connected to the fourth face of the sub-pixels located in the first row and the third face of one sub-pixel in the second row in the pixel unit through nodes. As shown in FIG. 1, for example, the data line D3 is arranged between two sub-pixels, i.e., the second sub-pixel 30 and the third sub-pixel 40, located in the second row in the second pixel unit 12, and is respectively connected to the fourth face of the first sub-pixel 20 located in the first row and the third face of the third sub-pixel 40 located in the second row in the second pixel unit 12.

In some embodiments, in a pixel repetition module, a configuration form in which one data line D corresponds to two longitudinally adjacent sub-pixels in the same pixel unit includes: when three sub-pixels in a pixel unit are arranged in an inverted triangle, the data line D is connected to the fourth face of one sub-pixel located in the first row and the third face of the sub-pixels located in the second row in the pixel unit through nodes. As shown in FIG. 1, for example, the data line D1 is arranged between two sub-pixels, i.e., the second sub-pixel 30 and the third sub-pixel 40, located in the first row in the first pixel unit 11, and is respectively connected to the fourth face of the second sub-pixel 30 located in the first row and the third face of the first sub-pixel 20 located in the second row in the first pixel unit 11.

In some embodiments, in a pixel repetition module, one data line D may correspond to two longitudinally adjacent sub-pixels in two adjacent pixel units, and each data line D is connected to the fourth face of one sub-pixel located in the first row in the pixel unit arranged in an inverted triangle and the second face of one sub-pixel located in the second row in the pixel unit arranged in a triangle through nodes. As shown in FIG. 1, for example, the data line D2 is connected to the fourth face of the third sub-pixel 40 located in the first row in the first pixel unit 11 and the third face of the second sub-pixel 30 located in the second row in the second pixel unit 12.

The arrangement of the data lines D as described above may reduce intersections of the data lines D and other lines connected to multiple sub-pixels, so as to make a layout of the pixel structure more reasonable and improve the display effect.

In some embodiments, for example, referring to FIG. 4, in a case that connection points of each data line D and the corresponding two sub-pixels are a common node, distances from the common node to the two sub-pixels connected thereto may be equal. For example, two sub-pixels are correspondingly connected to the same data line D, then the two sub-pixels may be respectively connected to the data line D through a common node on the same data line D, and distances from the two sub-pixels to the common node are equal, such that resistance values and/or capacitance values of the data line D respectively entering the pixel circuits corresponding to the two sub-pixels are same, so as to prevent uneven display brightness due to a difference in the resistance values and/or the capacitance values, in the case that the charging rate cannot meet a predetermined condition. FIG. 4 is a schematic diagram of a pixel structure according to another embodiment of the present disclosure. As shown in FIG. 4, the data line D1 includes a common node N1, and a distance from the second sub-pixel 30 located in the first row in the first pixel unit 11 to the common node N1 is equal or approximately equal to a distance from the first sub-pixel 20 located in the second row to the common node N1, such that a uniformity of display brightness may be ensured.

In some embodiments, the distances between two nodes with which the data line D is respectively connected to the two corresponding sub-pixels may be reduced as much as possible by adjusting the arrangement mode of the pixel circuits corresponding to the sub-pixels. FIG. 5 is a schematic diagram of s layout of a pixel structure according to an embodiment of the the present disclosure. As shown in FIG. 5, in a pixel unit in which three sub-pixels are arranged in an inverted triangle, a second transistor T2 in a pixel circuit corresponding to a sub-pixel 30 located in the first row is arranged close to second gate lines G2_1 and G2_2, and a second transistor T2 in a pixel circuit corresponding to a sub-pixel 20 located in the second row is arranged close to second gate lines G2_1 and G2_2. Such an arrangement may reduce a distance between the first node N1 and the second node N2, such that resistance values and/or capacitance values of the data line D1 entering the pixel circuits corresponding to the two sub-pixels are approximately equal.

In some embodiments, the pixel structure may further include sensing lines S, each of which corresponds to each pixel unit. In a pixel repetition module, one sensing line corresponds to one pixel unit, that is, one sensing line is connected to one pixel unit in a pixel repetition module. For example, three sub-pixels in a pixel unit are all connected to one sensing line S to reduce a quantity of the sensing lines S and improve the utilization rate of the pixel space. For example, the sensing line S in each pixel unit may be arranged between two sub-pixels in the same row.

As shown in FIG. 1, when three sub-pixels in the pixel unit are arranged in a triangle shape, for example, taking the second pixel unit 12 as an example, the sensing line S2 is connected to the third face of the first sub-pixel 20 located in the first row in the second pixel unit 12, and is connected to the fourth face of the second sub-pixel 30 and the third face of the third sub-pixel 40 located in the second row in the second pixel unit 12 respectively. Or when the three sub-pixels in the pixel unit are arranged in an inverted triangle, for example, taking the first pixel unit 11 as an example, the sensing line S1 is connected to the fourth face of the second sub-pixel 30 and the third face of the third sub-pixel 40 located in the first row in the first pixel unit 11 respectively, and is connected to the fourth face of the first sub-pixel 20 located in the second row. Such an arrangement may implement that three sub-pixels in one pixel unit are all connected to the same sensing line S, and may reduce intersections of sensing lines S and the data lines D, to avoid affecting the display effect.

In some embodiments, the pixel structure further includes power lines VDD, and a horizontal part of each power line VDD is connected to the first outer side or the second outer side of multiple pixel units located in the same row, such that sub-pixels located in the multiple pixel units in the same row may be connected to the same power line VDD. Such an arrangement may reduce a quantity of the power lines VDD and improve the utilization rate of the pixel space.

In some embodiments, each pixel unit corresponds to two power lines, that is, it is connected to two power lines, wherein a horizontal part of one power line is connected to a side, closest to the power line, of the sub-pixel located in the first row in each pixel unit, and a horizontal part of the other power line is connected to a side, closest to the power line, of the sub-pixel located in the second row in each pixel unit. As shown in FIG. 1, for example, a horizontal part of one power line VDD is connected to the first face of the second sub-pixel 30 and the third sub-pixel 40 located in the first row in the first pixel unit 11 and the first face of the first sub-pixel 20 located in the first row in the second pixel unit 12 respectively, and the other power line VDD is connected to the second face of the first sub-pixel 20 located in the second row in the first pixel unit 11 and the second face of the second sub-pixel 30 and third sub-pixel 40 located in the second row in the second pixel unit 12, to reduce intersections of the horizontal parts of the power lines VDD and the gate lines, thereby avoiding affecting the display effect.

In some embodiments, distances from the horizontal part of each power line VDD to multiple sub-pixels connected thereto are all equal. For example, as shown in FIG. 1, distances from two power lines VDD to multiple sub-pixels in the corresponding row thereof are all equal, that is, for the power line VDD close to the first face of the second sub-pixel 30 located in the first row in the first pixel unit 11 in FIG. 1, distances from the power line VDD to its corresponding second sub-pixel 30 and third sub-pixel 40 located in the first row in the first pixel unit 11 and the first sub-pixel 20 in the second pixel unit 12 are equal, and are referred to as a first distance below; and for the power line VDD close to the second face of the first sub-pixel 20 located in the second row in the first pixel unit 11 in FIG. 1, distances from the power line VDD to its corresponding first sub-pixel 30 located in the second row in the first pixel unit 11 and the second sub-pixel 30 and the third sub-pixel 40 in the second pixel unit 12 are equal, and are referred to as a second distance below. The first distance may be equal to the second distance.

In some embodiments, the three sub-pixels in each pixel unit are sub-pixels of different colors, for example, the colors of the three sub-pixels are red, green and blue, respectively, wherein the colors of the sub-pixels in each pixel unit may be the same as or different from those of the sub-pixels located in the same row in the adjacent pixel unit.

The present disclosure further provides a display panel, including the pixel structure as described in any one in the present disclosure. By arranging three sub-pixels in a pixel unit in a triangular structure, and arranging three sub-pixels in each pixel unit and three sub-pixels in its adjacent pixel unit which are arranged inversely with respect to each other, two gate lines in the first group of gate lines are located on the first outer side and the second outer side of the pixel units respectively, and two gate lines in the second group of gate lines are both located between the sub-pixels located in the first row and the sub-pixels located in the second row in the pixel units, such that multiple sub-pixels located in the same row in the adjacent pixel units may be connected to the same gate line, to reduce a quantity of lines arranged in the limited pixel space, thereby improving the utilization rate of the pixel space and making the display panel have higher resolution.

The present disclosure further provides a display apparatus, including the pixel structure as described in any one in the present disclosure. By arranging three sub-pixels in a pixel unit in a triangular structure, and arranging three sub-pixels in each pixel unit and three sub-pixels in its adjacent pixel unit which are arranged inversely with respect to each other, two gate lines in the first group of gate lines are located on the first outer side and the second outer side of the pixel units respectively, and two gate lines in the second group of gate lines are both located between the sub-pixels located in the first row and the sub-pixels located in the second row in the pixel units, such that multiple sub-pixels located in the same row in the adjacent pixel units may be connected to the same gate line, to reduce a quantity of lines arranged in the limited pixel space, thereby improving the utilization rate of the pixel space and making the display panel have higher resolution and reducing a manufacturing cost of the display apparatus.

Figure 6:
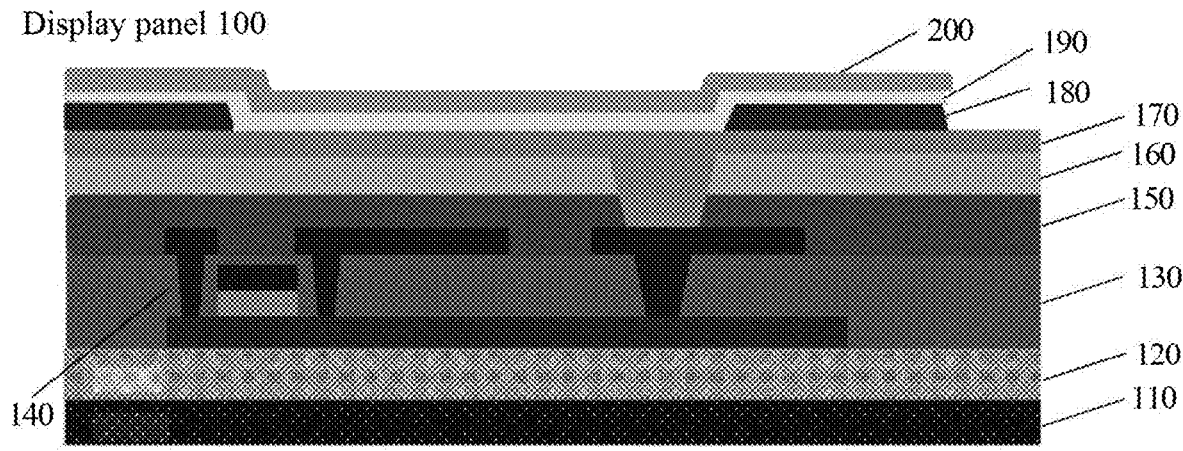
FIG. 6 is a schematic structural diagram of a display apparatus according to an embodiment of the present disclosure.

The display apparatus includes, for example, a display panel 100 shown in FIG. 6. The display apparatus may be any product or component with a display function such as a mobile phone, a tablet computer, a television, a display, a notebook computer, a digital photo frame, or a navigator, etc.

FIG. 6 is a schematic cross-sectional view of a display panel 100 according to an embodiment of the present disclosure. As shown in FIG. 6, the display panel 100 is disposed from top to bottom sequentially with a substrate 110, a buffer layer 120 formed on the substrate 110, an insulating layer 130 formed on the buffer layer 120, a thin film transistor 140 formed on the insulating layer 130, and a passivation layer 150, a resin layer 160, a transparent electrode 170, a pixel definition layer 180, a light emitting layer 190 and a cathode 200 sequentially formed on the thin film transistor 140. Herein, the thin film transistor 140 is located inside the sub-pixel in the pixel structure described in any one in the present disclosure, and is taken as a part of the pixel circuit corresponding to the sub-pixel. Using the pixel structure described in any one in the present disclosure may reduce a quantity of lines arranged in the limited pixel space, improve the utilization rate of the pixel space, such that wider metal lines may be used when the display panel 100 is manufactured, to increase an area of a capacitor in the pixel circuit, and prevent the power line VDD from being arranged in an active layer of the thin film transistor 140 during the manufacturing process of the display panel 100, to avoid an existence of a difference in a brightness uniformity in brightness compensation.

In addition, although the exemplary embodiments have been described herein, their scope includes any and all embodiments having equivalent elements, modifications, omissions, combinations (e.g., solutions in which various embodiments intersect), adaptations or changes based on the present disclosure. Elements in the claims will be broadly interpreted on the basis of the language used in the claims, and are not limited to the examples described in this specification or during the implementation of the present disclosure, and the examples thereof will be interpreted to be non-exclusive. Therefore, this specification and the examples are intended to be considered to be exemplary only, and the true scope and spirit will be indicated by the full range of the following claims and equivalents thereof.

The above description is intended to be illustrative and not limiting. For example, the above examples (or one or more solutions thereof) may be used in combination with each other. For example, other embodiments may be used by those of ordinary skill in the art upon reading the above description. In addition, in the above specific implementations, various features may be grouped together to simplify the present disclosure. This should not be interpreted as an intention that an unclaimed disclosed feature is essential for any claim. On the contrary, the subject matter of the present disclosure may be less than all features of a particular disclosed embodiment. Therefore, the following claims are hereby incorporated into the detailed implementations as examples or embodiments, wherein each claim is independently used as a separate embodiment, and it is considered that these embodiments may be combined with each other in various combinations or arrangements. The scope of the present disclosure should be determined with reference to the full scope of the appended claims and equivalents to which these claims are entitled.

The above embodiments are only exemplary embodiments of the present disclosure, and are not intended to limit the present disclosure. The protection scope of the present disclosure is defined by the claims. Various modifications or equivalent substitutions may be made to the present disclosure by those skilled in the art within the essence and the protection scope of the present disclosure, and such modifications or equivalent substitutions should be regarded as falling into the protection scope of the present disclosure as well.

What is claimed is:

1. A pixel structure, comprising: gate lines and data lines disposed crosswise and a plurality of pixel repetition modules distributed in an array, wherein a pixel repetition module comprises:
    a plurality of pixel units arranged in order, wherein each pixel unit comprises three sub-pixels arranged in a triangular structure, and the three sub-pixels in each pixel unit and the three sub-pixels in an adjacent pixel unit are arranged inversely with respect to each other;
    each pixel unit corresponds to two groups of gate lines, wherein each group of gate lines comprise two gate lines parallel to each other, a first group of gate lines are located on a first outer side and a second outer side of the pixel units respectively, and a second group of gate lines are both located between the sub-pixels located in a first row and the sub-pixels located in a second row in the pixel units.

2. The pixel structure according to claim 1, wherein two gate lines in the first group of gate lines are respectively connected to two sides, closest to the gate lines, of the sub-pixel located in the first row and the sub-pixel located in the second row in each pixel unit, and two gate lines in the second group of gate lines are respectively connected to two sides, closest to the gate lines, of the sub-pixel located in the first row and the sub-pixel located in the second row in each pixel unit.

3. The pixel structure according to claim 2, wherein the gate lines comprise vertical parts, through which the gate lines are connected to the corresponding sub-pixels.

4. The pixel structure according to claim 3, wherein the three sub-pixels in each pixel unit are sub-pixels of different colors.

5. The pixel structure according to claim 2, wherein distances from the two gate lines in the first group of gate lines to the corresponding sub-pixels are equal; and distances from the two gate lines in the second group of gate lines to the corresponding sub-pixels are equal.

6. The pixel structure according to claim 2, wherein the three sub-pixels in each pixel unit are sub-pixels of different colors.

7. The pixel structure according to claim 1, wherein in a pixel repetition module, a data line is connected to two longitudinally adjacent sub-pixels in a same pixel unit respectively, or the data line is respectively connected to two longitudinally adjacent sub-pixels respectively located in two adjacent pixel units.

8. The pixel structure according to claim 7, wherein the data line comprises a first vertical part and a second vertical part parallel to each other, and a horizontal part connecting the first vertical part with the second vertical part is disposed between the first vertical part and the second vertical part.

9. The pixel structure according to claim 8, wherein nodes are disposed on the first vertical part and the second vertical part, and the data line is connected to two corresponding sub-pixels through the nodes respectively disposed on the first vertical part and the second vertical part.

10. The pixel structure according to claim 8, wherein one or two nodes are disposed on the horizontal part, and the data line is connected to the two sub-pixels through the one or two nodes.

11. The pixel structure according to claim 10, wherein there is one node disposed on the horizontal part, and the data line is connected to the two sub-pixels through the one node respectively.

12. The pixel structure according to claim 10, wherein there are two nodes disposed on the horizontal part, wherein each node is connected to one of two sub-pixels respectively.

13. The pixel structure according to claim 1, further comprising sensing lines, wherein one sensing line is connected to one of the pixel units in one pixel repetition module.

14. The pixel structure according to claim 13, wherein that one sensing line is connected to one of the pixel units comprises: the sensing line is connected to a side of the sub-pixel located in the first row in one of the pixel units, and is respectively connected to a side of the two sub-pixels located in the second row; or the sensing line is respectively connected to a side of the two sub-pixels located in the first row in one of the pixel units, and is connected to a side of the sub-pixel located in the second row.

15. The pixel structure according to claim 1, further comprising power lines, wherein a horizontal part of each power line is connected to the first outer side or the second outer side of a plurality of pixel units located in the same row.

16. The pixel structure according to claim 15, wherein each pixel unit corresponds to two power lines, wherein the horizontal part of one power line is connected to a side, closest to the power line, of the sub-pixel located in the first row in each pixel unit, and the horizontal part of the other power line is connected to a side, closest to the power line, of the sub-pixel located in the second row in each pixel unit.

17. The pixel structure according to claim 15, wherein a distance from the horizontal part of each power line to the sub-pixel connected thereto is equal.

18. The pixel structure according to claim 1, wherein the three sub-pixels in each pixel unit are sub-pixels of different colors.

19. A display panel, comprising the pixel structure according to claim 1.

20. A display apparatus, comprising the pixel structure according to claim 1.

* * * * *